United States Patent
Sakata et al.

(10) Patent No.: US 6,771,535 B2
(45) Date of Patent: Aug. 3, 2004

(54) SEMICONDUCTOR DEVICE

(75) Inventors: Takeshi Sakata, Hino (JP); Satoru Hanzawa, Hachioji (JP); Hideyuki Matsuoka, Nishitokyo (JP); Katsuro Watanabe, Odawara (JP); Kenchi Ito, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/412,423

(22) Filed: Apr. 14, 2003

(65) Prior Publication Data

US 2003/0173628 A1 Sep. 18, 2003

Related U.S. Application Data

(63) Continuation of application No. 10/081,537, filed on Feb. 25, 2002, now Pat. No. 6,573,586.

(30) Foreign Application Priority Data

Jun. 12, 2001 (JP) ........................................ 2001-176465

(51) Int. Cl.[7] .............................................. G11C 11/00
(52) U.S. Cl. ........................ 365/158; 365/177; 365/63; 257/529
(58) Field of Search ................................ 365/158, 177, 365/63; 257/529, 577

(56) References Cited

U.S. PATENT DOCUMENTS 6,055,178 A * 4/2000 Naji ........................... 365/158
6,462,980 B2 10/2002 Schuster-Woldan et al.
6,490,217 B1 * 12/2002 DeBrosse et al. ......... 365/225.5

OTHER PUBLICATIONS

Roy Scheuerlein, William Gallagher, Stuart Parkin, Alex Lee, Sam Ray, Ray Robertazzi and William Reohr, "a 10ns Read and Write Non–Volatile Memory Array Using a Magnetic Tunnel Junction and FET Switch in each Cell", 2000 IEEE International Solid–State Circuits Conference, Digest of Technical Papers, pp. 128–135.

M. Durlam, P. Naji, M. DeHerrera, S. Tehrani, G. Kerszykowski, K. Kyler "Nonvolatile RAM Based on Magnetic Tunnel Junction Elements", 2000 IEEE International Solid–State Circuits Conference, Digest of Technical Papers, pp. 136–142.

* cited by examiner

Primary Examiner—Vu A. Le
Assistant Examiner—Toan Le
(74) Attorney, Agent, or Firm—Reed Smith LLP; Stanley P. Fisher, Esq.; Juan Carlos A. Marquez, Esq.

(57) ABSTRACT

Disclosed are a fast, highly-integrated and highly-reliable magnetoresistive random access memory (MRAM) and a semiconductor device which uses the MRAM. The semiconductor device performs the read-out operation of the MRAM using memory cells for storing information by using a change in magnetoresistance of a magnetic tunnel junction (MTJ) element with a high S/N ratio. Each memory cell includes an MTJ element and a bipolar transistor. The read-out operation is carried out by selecting a word line, amplifying a current flowing in the MTJ element of a target memory cell by the bipolar transistor and outputting the-amplified current to an associated read data line.

15 Claims, 18 Drawing Sheets

SEMICONDUCTOR DEVICE

This application is a continuation application of U.S. application Ser. No. 10/081,537 filed on Feb. 25, 2002 now U.S. Pat. No. 6,573,586.

BACKGROUND OF THE INVENTION

1. Field of the Invention

The present invention relates to a semiconductor device, and, more particularly, to a semiconductor device that includes fast, highly-integrated and highly-reliable memory using memory cells which store information using a change in magnetoresistance.

2. Description of the Prior Art

A magnetoresistive random access memory (MRAM) has been developed as a memory which is not limited to the number of read/write operations while it is a non-volatile memory.

An MRAM stores information by utilizing such a magnetoresistive effect that the resistance of an element varies depending on the direction of magnetization of a ferromagnetic material in a memory cell. Recently, attempts have been made to development magnetic tunnel junction (MTJ) elements which have a greater magnetoresistive ratio called magnetoresistance (MR) than elements of the prior art and to apply the MTJ elements to MRAMs. The attempts have led to a possibility of realizing a memory which performs as fast a read-out operation as a static random access memory (SRAM) and whose integration scale is as large as that of a dynamic random access memory (DRAM).

For example, such memories are described in IEEE International Solid-State Circuits Conference, DIGEST of TECHNICAL PAPERS, pp. 128–129 and pp. 130–131, 2000.

FIG. 2 shows the basic structure of memory cells used in the memories. Each memory cell comprises a single MTJ element MTJ and a single transistor MMC, which are connected to a write word line WW, a read word line WR and a data line DL.

The MTJ element MTJ has such a structure as to have a tunnel insulating film sandwiched between a fixed layer of a ferromagnetic material whose direction of magnetization is fixed in a normal operation and a free layer of a ferromagnetic material whose direction of magnetization can be flipped by a read-out operation. The resistance across the two ends of the MTJ element changes in accordance with the directions of the magnetization of the two ferromagnetic layers. The resistance is low when both directions of the magnetization are the same, whereas the resistance is high when they are opposite to each other.

A read-out operation is executed as illustrated in FIG. 3. The read word line WR is selected to enable the transistor MMC, a voltage is applied across the ends of the MTJ element MTJ and stored information is read out by detecting a current $I_{DL}$ which flows through the data line DL according to the magnetoresistance of the MTJ element MTJ.

A write operation is executed as illustrated in FIG. 4. Specifically, with a current $I_{ww}$ of the selected write word line WW serving as a write word line current $I_{ws}$, the write operation is carried out by letting a write current $I_{D1}$ or $I_{D0}$ corresponding to write data "1" or "0" flow through the data line DL.

At this time, a magnetoresistive ratio MR or the ratio of an increase in resistance in the high resistance state to that in the low resistance state shows a hysteresis characteristic as shown in FIG. 5. The hard axis magnetic field that is produced by the write word line current $I_{ws}$ makes it easier to flip the magnetization of the MTJ element, thus providing a narrow hysteresis characteristic with respect to the data line current $I_{DL}$ that produces an easy axis magnetic field. This makes it possible to write stored information by flipping the magnetization of only the memory cell that is selected by the write word line WW.

To make the practical use of an MRAM using the memory cells as shown in FIG. 2, the high S/N ratio is important. As shown in FIG. 3, a read signal from a memory cell is the data line current $I_{DL}$ according to the invention the magnetoresistance of the MTJ element. As described in the aforementioned documents, the magnetoresistive ratio MR of the MTJ element is as high as several tens of %. Further, as shown in FIG. 6, the magnetoresistive ratio MR is highly dependent on the applied voltage. For example, whereas the magnetoresistive ratio $MR_0$ in the vicinity of the applied voltage of 0 V is 40%, the applied voltage, $V_H$, that provides a magnetoresistive ratio of 20%, a half the magnetoresistive ratio $MR_0$, is about 0.3 V. Therefore, the difference between signal currents for write data of "0" and "1" has a peak value with respect to the applied voltage and the signal current cannot be increased by increasing the applied voltage.

SUMMARY OF THE INVENTION

Accordingly, it is an object of the invention to provide a semiconductor device which overcomes the conventional problem mentioned above. In other words, the invention aims at providing an MRAM which has a large signal current and a high S/N ratio, and a semiconductor device including such an MRAM.

To achieve the object, a semiconductor device according to the invention comprises a plurality of memory cells; a plurality of word lines for selecting the plurality of memory cells; and a plurality of data lines which are so laid out as to be perpendicular to the plurality of word lines and through which signals are read out from the plurality of memory cells, each of the plurality of memory cells including a magnetoresistive element and a bipolar transistor. That is, in the semiconductor device according to the invention, each memory cell is designed to include a magnetoresistive element and a bipolar transistor, information is stored by the state of the magnetization of the magnetoresistive element and the current which flows across the magnetoresistive element is amplified by the bipolar transistor to be a read current.

It is preferable that each of plural memory cells in the semiconductor device should be constituted by a single magnetoresistive element and a single bipolar transistor.

In the semiconductor device, each of plural memory cells may be constituted by two magnetoresistive elements and two bipolar transistors.

The object of the invention and other objects thereof will become apparent from the detailed description given hereinafter with reference to the accompanying drawings. Throughout the diagrams, same reference symbols indicate same or like components.

DETAILED DESCRIPTION OF THE PREFERRED EMBODIMENTS

Semiconductor devices according to preferred embodiments of the invention will now be described.

Figure 1:
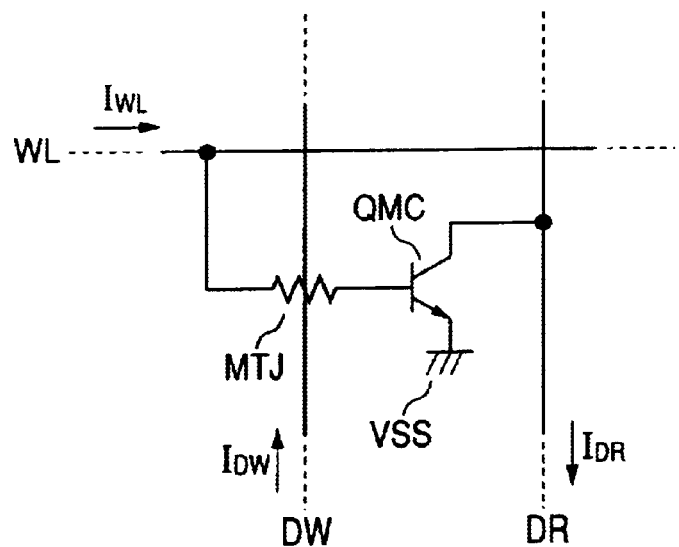
FIG. 1 is a diagram showing the structure of a memory cell according to the invention.

FIG. 1 shows an example of a memory cell structure according to the invention. Each memory cell comprises an npn bipolar transistor QMC and an MTJ element MTJ and stores information by the state of magnetization in the MTJ element MTJ. The MTJ element MTJ has one end connected to a word line WL and the other end connected to the base of the bipolar transistor QMC. A write data line DW is laid out in such a way as to control the MTJ element MTJ. The bipolar transistor QMC has an emitter connected to a ground voltage VSS and a collector connected to a read data line DR. Here, "write" and "read" mean exchange of a signal between a memory cell and the associated data line and differ from the read-out operation and write operation of the entire memory.

Figure 2:
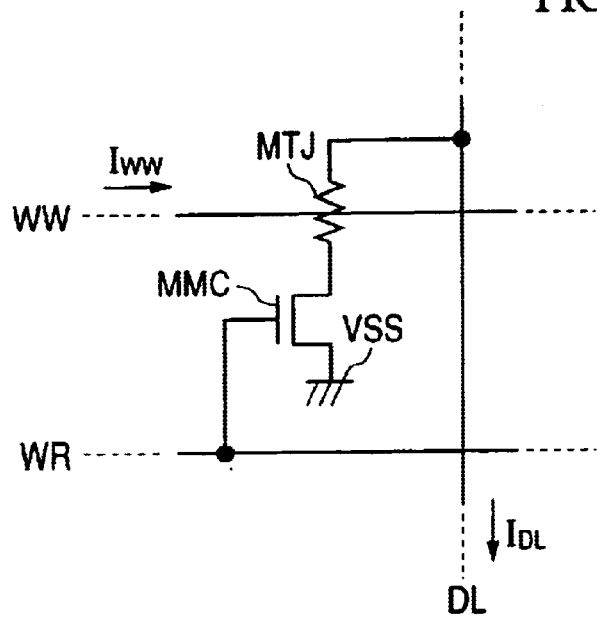
FIG. 2 is a diagram showing the structure of a memory cell according to the prior art.
Figure 3:
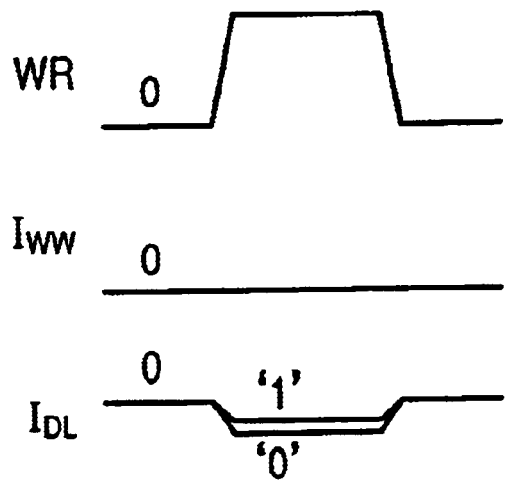
FIG. 3 is a diagram illustrating the read-out operation of the conventional memory cell.
Figure 4:
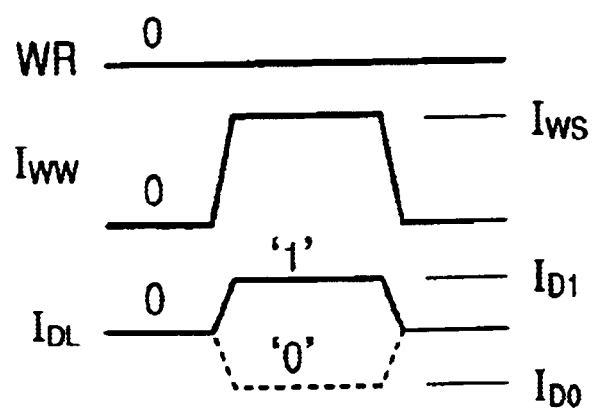
FIG. 4 is a diagram illustrating the write operation of the conventional memory cell.

The memory cell, like the conventional memory cell using an MOS transistor shown in FIG. 2, is realized by a single transistor and a single MTJ element. Further, those two types of memory cells are identical in the number of interconnection lines or a total of three lines including word and data lines. Like the conventional memory cell, therefore, the memory cell of the invention is suitable for large scale integration.

Figure 7:
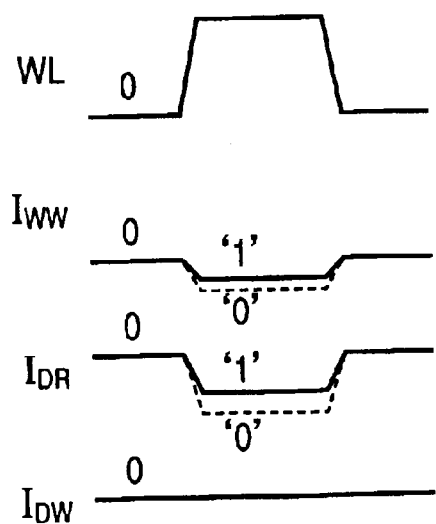
FIG. 7 is a diagram illustrating the read-out operation of the memory cell in FIG. 1.

A read-out operation is executed as illustrated in FIG. 7. A word line WL is selected to be at a high level, thereby applying a voltage across the ends of the MTJ element MTJ and enabling the bipolar transistor QMC. At this time, as the voltage of the read data line DR is set in such a way that the bipolar transistor QMC operates in an active area, the current, $I_{WL}$, that flows according to the magnetoresistance of the MTJ element MTJ is amplified by the bipolar transistor QMC and read onto the read data line DR. Stored information is read out by detecting a read data line current $I_{DR}$. At this time, no current is let flow through the write data line DW.

Figure 6:
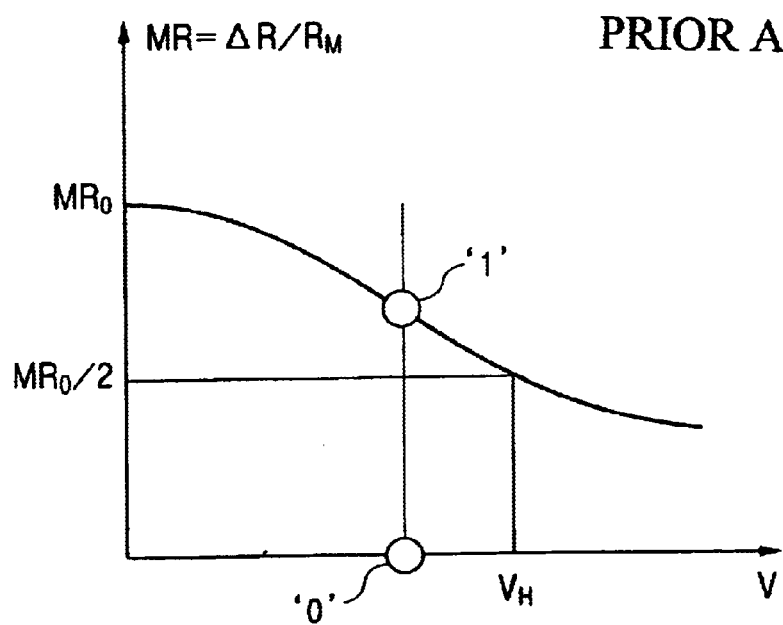
FIG. 6 is a diagram illustrating the voltage dependency of the MR ratio of the MTJ element.

The memory cell structure that is provided with the current amplification capability using the bipolar transistor increases the signal current $I_{DR}$. Because it is unnecessary to increase the applied voltage to the MTJ element in order to increase the signal current, the memory cell can operate in an area where the magnetoresistive ratio MR of the MTJ element is large even if the magnetoresistive ratio MR has the voltage dependency as shown in FIG. 6. A sufficient signal current can be acquired with a lower applied voltage than an applied voltage $V_H$ which reduces the magnetoresistive ratio MR to a half the magnetoresistive ratio $MR_0$ in the vicinity of 0 V. In case where $V_H$ is about 0.3 V, for example, the memory cell can operate even if the applied voltage is set to about 0.2 V. This can increase the average levels of signal currents of "1" and "0" and the difference between "1" and "0", so that an MRAM which operates with a high S/N ratio can be realized. What is more, the selection capability by the word line is achieved by the bipolar transistor QMC that performs current amplification.

Figure 5:
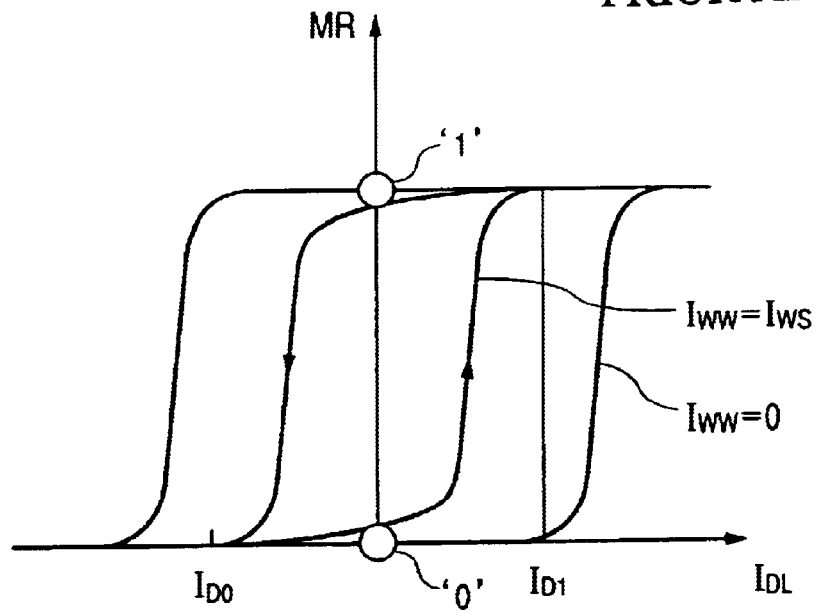
FIG. 5 is a diagram depicting a hysteresis characteristic in the write mode of an MTJ element.
Figure 8:
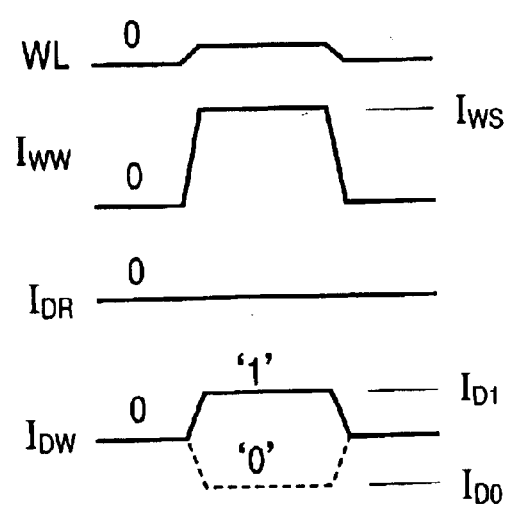
FIG. 8 is a diagram illustrating the write operation of the memory cell in FIG. 1.

A write operation is executed as illustrated in FIG. 8. Specifically, with a current $I_{WL}$ of the selected word line WL serving as a write word line current $I_{ws}$, the write operation is carried out by letting a write current $I_{D1}$ or $I_{D0}$ corresponding to write data "1" or "0" flow through the write data line DW. At this time, the magnetoresistive ratio MR or the ratio of an increase in resistance in the high resistance state to that in the low resistance state shows a hysteresis characteristic as shown in FIG. 5. The hard axis magnetic field that is produced by the word line current $I_{ws}$ makes it easier to flip the magnetization of the MTJ element, thus providing a narrow hysteresis characteristic with respect to the write data line current $I_{DW}$ that produces an easy axis magnetic field. This makes it possible to write stored information by flipping the magnetization of only the memory cell that is selected by the word line WL. At this time, as the voltage of the word line WL is suppressed to a sufficiently low voltage, the bipolar transistor QMC stays in the cut-off area, thus preventing the flow of a wasteful current.

An example of the structure of the memory cell shown in FIG. 1 will now be discussed.

Figure 9:
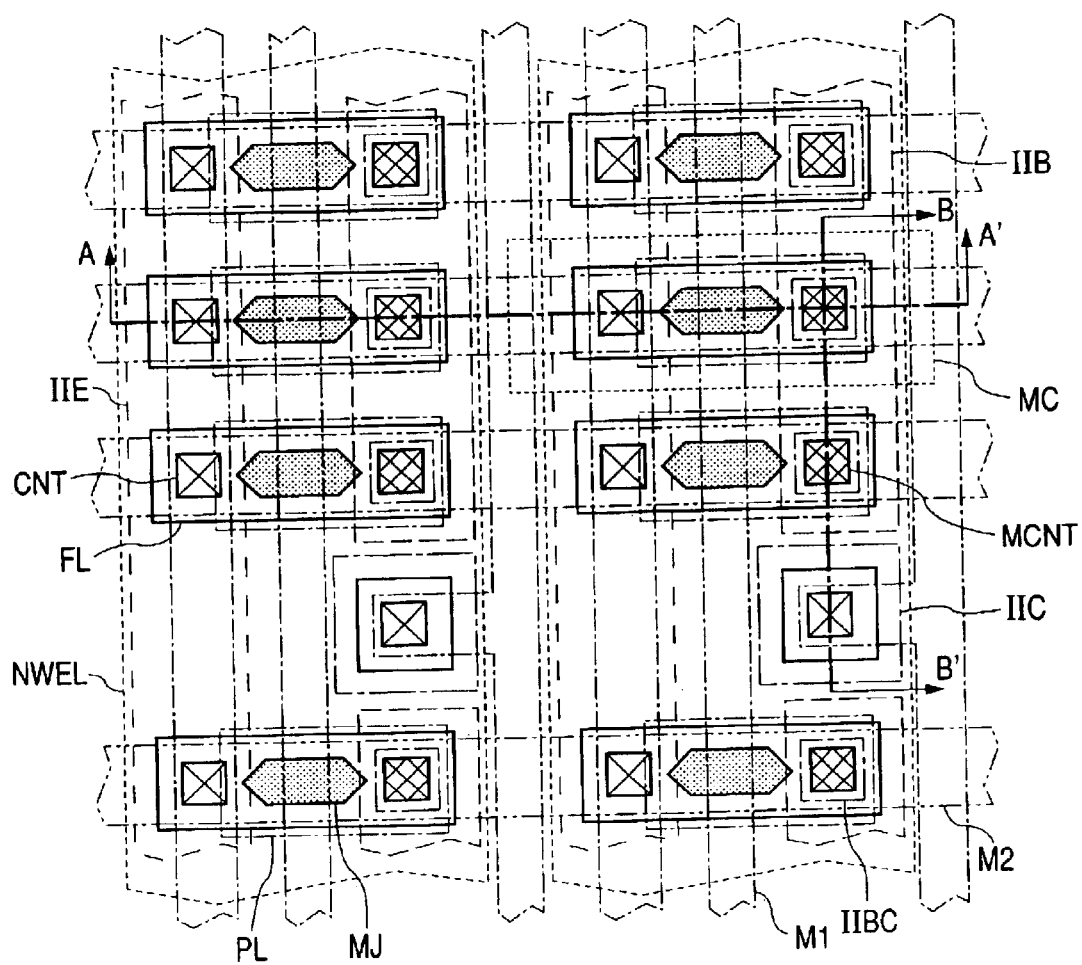
FIG. 9 is a diagram showing the layout of the memory cells in FIG. 1.

FIG. 9 shows the layout of the memory cells. A broken-line rectangular block MC is the area of a single memory cell. In this diagram, reference symbol "NWEL" is an n-type well pattern, reference symbol "FL" is an active area pattern, and reference symbols "IIC", "IIB" and "IIE" respectively denote ion implantation patterns for the collector, base and emitter of the bipolar transistor. "PL" is the lower electrode pattern of the MTJ element, "MJ" is an MTJ element pattern and "MCNT" is a memory contact pattern. Further, "M1" and "M2" respectively denote a first interconnection line pattern and a second interconnection line pattern, and "CNT" is a contact pattern. Well-known optical lithography can be used in the patterning of those patterns.

Figure 10:
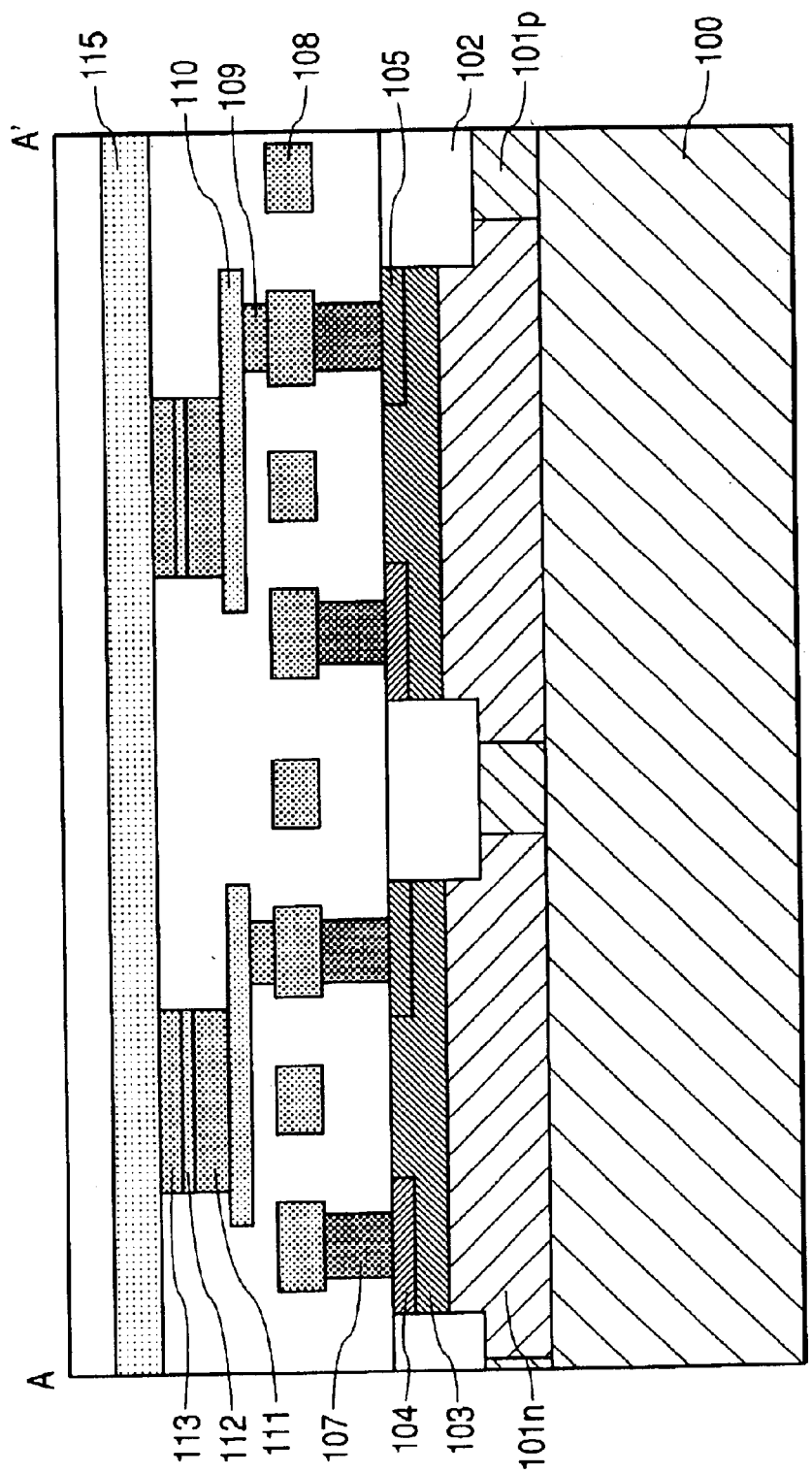
FIG. 10 is a cross-sectional view of a portion of the layout of the memory cells in FIG. 9 along the line A–A'.
Figure 11:
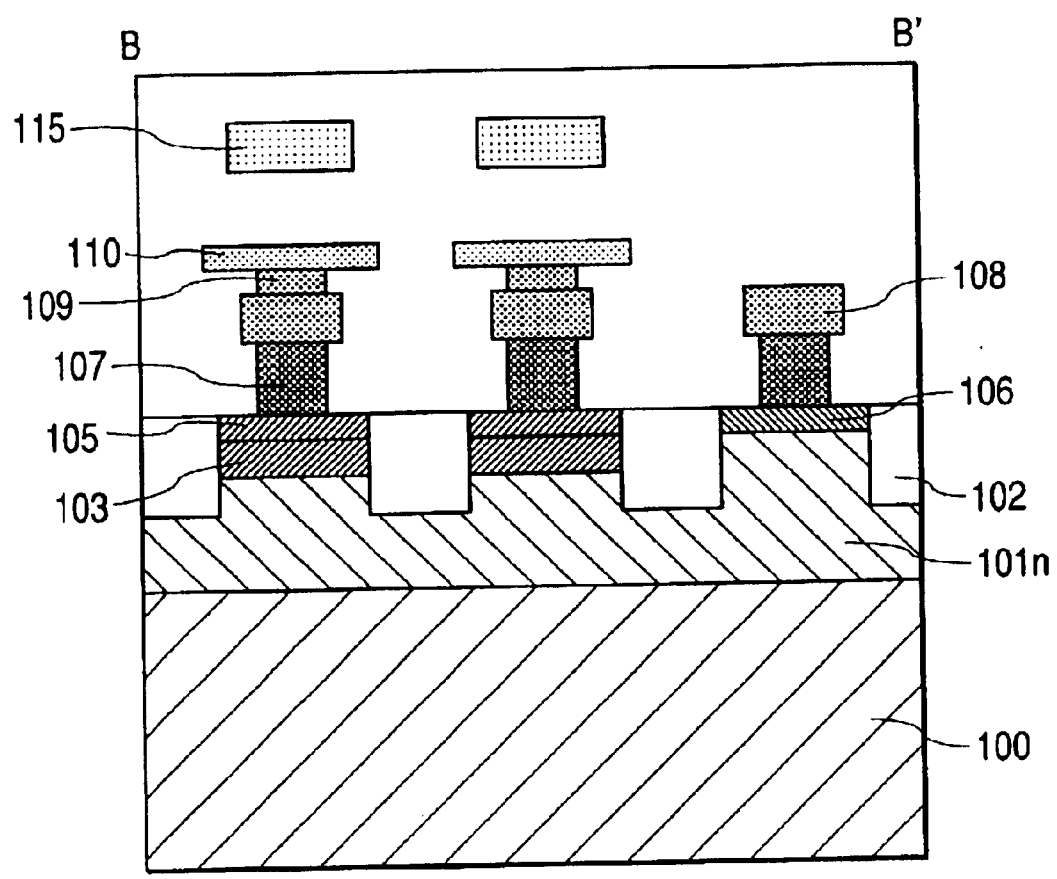
FIG. 11 is a cross-sectional view of a portion of the layout of the memory cells in FIG. 9 along the line B–B'.

FIG. 10 is a cross-sectional view of a portion of the layout of the memory cells in FIG. 9 along the line A—A', and FIG. 11 is likewise a cross-sectional view of a portion of the layout of the memory cells along the line B—B'. In those diagrams, reference symbol "100" indicates a p-type semiconductor substrate and reference symbol "101n" indicates an n-type well which will serve as the collector of the bipolar transistor and is formed by performing ion implantation into the pattern NWEL. Reference symbol "101p" is a p-type well which isolates the n-type well 101n and is formed by performing ion implantation into a pattern which is the pattern NWEL inverted.

Reference symbol "102" is an isolation oxide film which is formed by, for example, etching that area of the substrate which is not surrounded by the pattern FL and burying an oxide film in the area. Reference symbol "103" is a p-type area which will serve as the base of the bipolar transistor and is formed in an active area where the isolation oxide film 102 is not located by performing ion implantation into that area of the memory cell array which is not surrounded by the pattern IIC.

Reference symbols "104", "105" and "106" respectively denote an n-type diffusion layer which will serve as the emitter of the bipolar transistor, a p-type diffusion layer which becomes the lead-out portion of the base, and an n-type diffusion layer which becomes the lead-out portion of the collector. Those three diffusion layers are formed by carrying out ion implantation in accordance with the patterns IIE, IIB and IIC.

Reference symbol "107" is a plug of a contact between the associated diffusion layer and a first interconnection line 108. The plugs 107 are formed in accordance with contact patterns CNT and MCNT. The first interconnection line 108 is formed according to a pattern M1, and the interconnection line that runs directly under the MTJ element is the data line DW. That line of the first interconnection line 108 which runs through an area where there is no MTJ element is the read data line DR and is used to supply a ground voltage VSS and connect the bipolar transistor to the MTJ element.

Reference symbol "109" denotes a memory contact which connects the first interconnection line 108 to a lower electrode 110 of the MTJ element and is formed according to the memory contact pattern MCNT. The lower electrode 110 of the MTJ element is processed according to a lower electrode pattern PL. It is desirable to use a material, such as a noble metal, which is suitable for the formation of a ferromagnetic material, for the lower electrode 110.

Reference symbols "111", "112" and "113" respectively denote a fixed ferromagnetic layer, a tunnel insulating film and a free ferromagnetic layer, which constitute the MTJ element and are formed by etching with an MTJ element pattern after lamination.

Reference symbol "115" is a second interconnection line which is formed according to a pattern M2. The second interconnection line 115, which contacts the free layer 113 of the MTJ element, is used as the word line WL in FIG. 1. A through hole, which is not provided in the memory cell array, is provided in a peripheral circuit area to connect the first interconnection line 108 to the second interconnection line 115.

As the collectors of the bipolar transistors are commonized in the word line direction in the above-described manner, the isolation area becomes smaller, making it possible to reduce the area of the memory cells. As the emitter and base of the bipolar transistor are arranged in the word line direction, the area of the memory cell becomes longer in the word line direction so that the pattern of the MTJ element can be made longer in the word line direction. This pattern improves the axis preference of the free ferromagnetic layer 113 to ensure a stable operation while making the magnetic field produced by the data line current a hard axis magnetic field and the magnetic field produced by the word line current an easy axis magnetic field. Further, the stable magnetization flipping is made possible by making a pattern MJ of the MTJ element hexagonal with the corners of the rectangle cut off.

Next, another memory cell structure will be described. This structure is characterized in that the emitter of the bipolar transistor is provided on the substrate side which is the opposite side to the location of the emitter of the ordinary bipolar transistor structure used in the memory cell structure shown in FIGS. 9 to 11.

Figure 12:
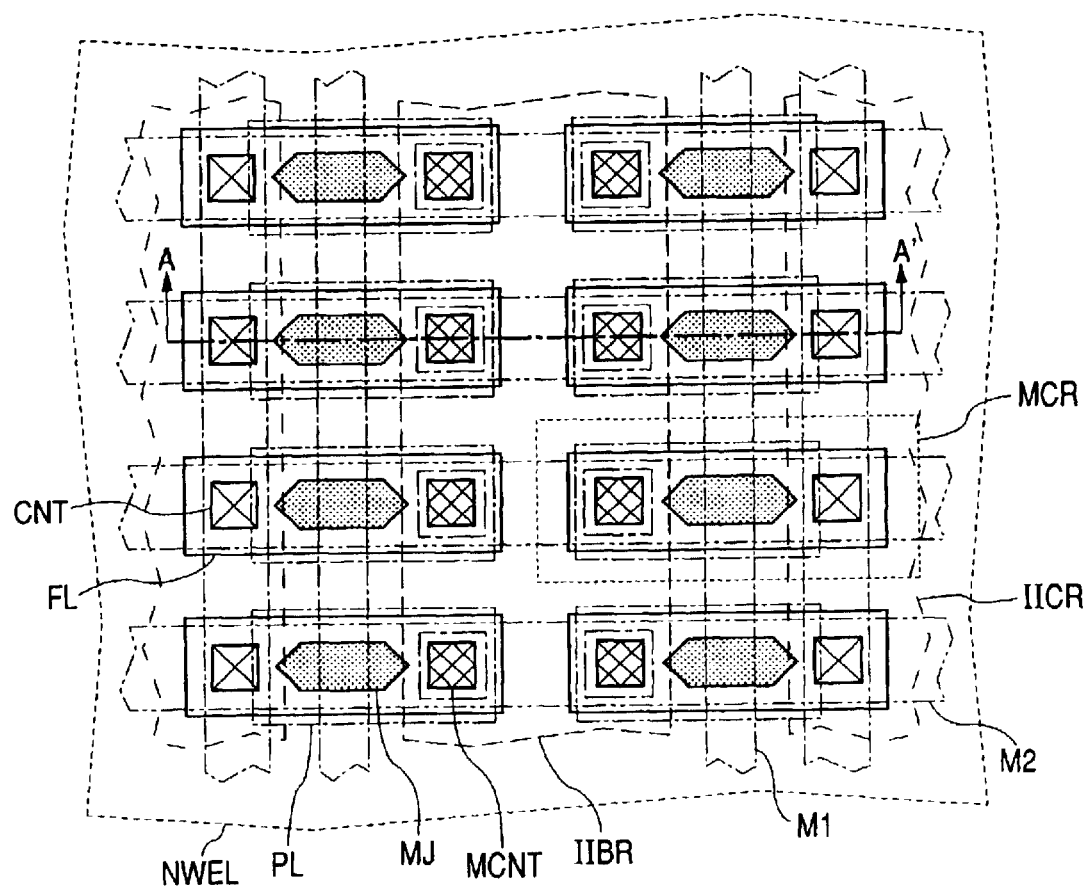
FIG. 12 is a diagram showing another layout of the memory cells in FIG. 1.

FIG. 12 shows another layout of the memory cells and a broken-line rectangular block MCR is the area of a single memory cell. The n-type well pattern NWEL lies over the entire memory cell array. As in FIG. 9, reference symbol "FL" is an active area pattern, "PL" is the lower electrode pattern of the MTJ element, "MJ" is an MTJ element pattern, "MCNT" is a memory contact pattern, "CNT" is a contact pattern, "M1" is a first interconnection line pattern, and "M2" is a second interconnection line pattern. Reference symbols "IICR" and "IIBR" respectively denote ion implantation patterns for the collector and base of the bipolar transistor.

Figure 13:
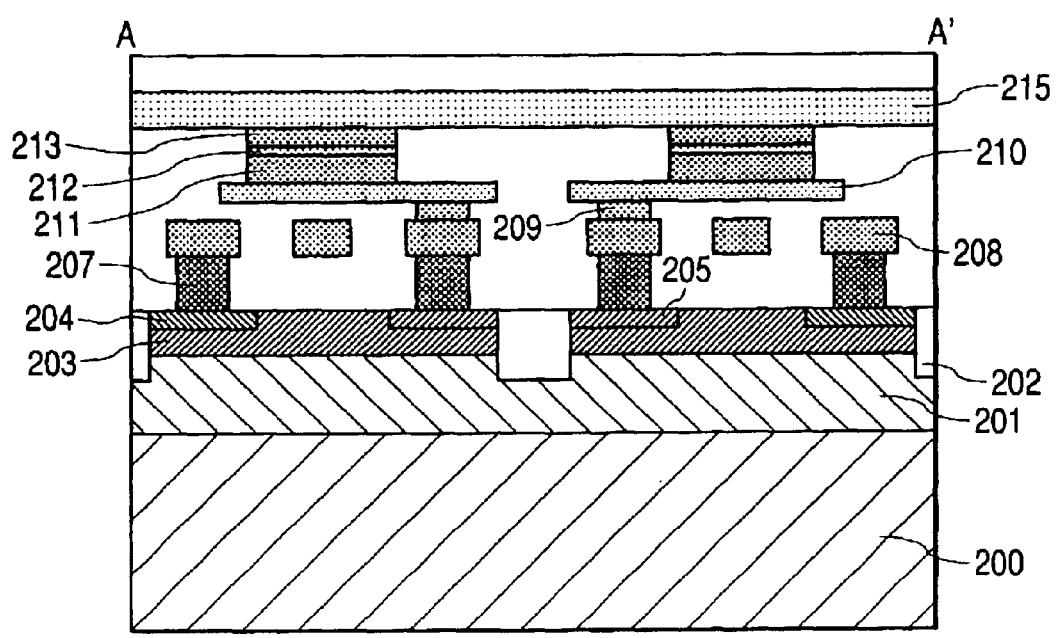
FIG. 13 is a cross-sectional view of a portion of the layout of the memory cells in FIG. 12 along the line A–A'.

FIG. 13 is a cross-sectional view of a portion of the layout of the memory cells in FIG. 12 along the line A—A'. In FIG. 13, reference symbol "200" indicates a p-type semiconductor substrate and reference symbol "201" denotes an n-type well which is formed by the pattern NWEL and will serve as the emitter of the bipolar transistor. Reference symbol "202" is an isolation oxide film which is formed in that area which is not surrounded by the pattern FL. Reference symbol "203" is a p-type area which will serve as the base of the bipolar transistor and is formed in an active area where the isolation oxide film 202 is not located by performing ion implantation into the entire surface of the memory cell array.

Reference symbols "204" and "205" respectively denote an n-type diffusion layer which will serve as the collector of the bipolar transistor and a p-type diffusion layer which becomes the lead-out portion of the base. The two diffusion layers are formed by carrying out ion implantation in accordance with the patterns IICR and IIBR. Reference symbol "207" is a plug of a contact between the associated diffusion layer and a first interconnection line 208. The plugs 207 are formed in accordance with the contact patterns CNT and MCNT.

The first interconnection line 208 is formed according to the pattern M1, and is used to connect the data lines DW and DR, the bipolar transistor and the MTJ element. Reference symbol "209" denotes a memory contact which is formed according to the memory contact pattern MCNT. The lower electrode 210 of the MTJ element is processed according to the lower electrode pattern PL.

Reference symbols "211", "212" and "213" respectively denote a fixed ferromagnetic layer, a tunnel insulating film and a free ferromagnetic layer, which are processed according to the MTJ element pattern MJ and constitute the MTJ element. Reference symbol "215" is a second interconnection line which is formed according to the pattern M2 and is used as the word line WL in FIG. 1.

The use of an n-type well as the emitter eliminates the need for an isolation area for the n-type well in the memory cell array. What is more, the provision of the well on the entire surface of the memory cell array reduces the effective resistance and eliminates the need for the portion that supplies the ground voltage VSS. As a result, the area of the memory cell can be made smaller than the memory cell structure shown in FIGS. 9 to 11.

In case where the resistance of the n-type well needs to be considered, the portion that supplies the ground voltage VSS should be provided at an adequate interval, e.g., every 16 data lines. While this structure has a difficulty in increasing the current amplification factor of the bipolar transistor, it is allowable because the current amplification factor of the bipolar transistor in the memory cell shown in FIG. 1 can range from, for example, about 10 to about 20, not so large, depending on the characteristic of the MTJ element.

A different memory cell structure will now be discussed. The feature of this structure lies in that the word line WL in FIG. 1 is arranged at the lower portion of the MTJ element.

Figure 14:
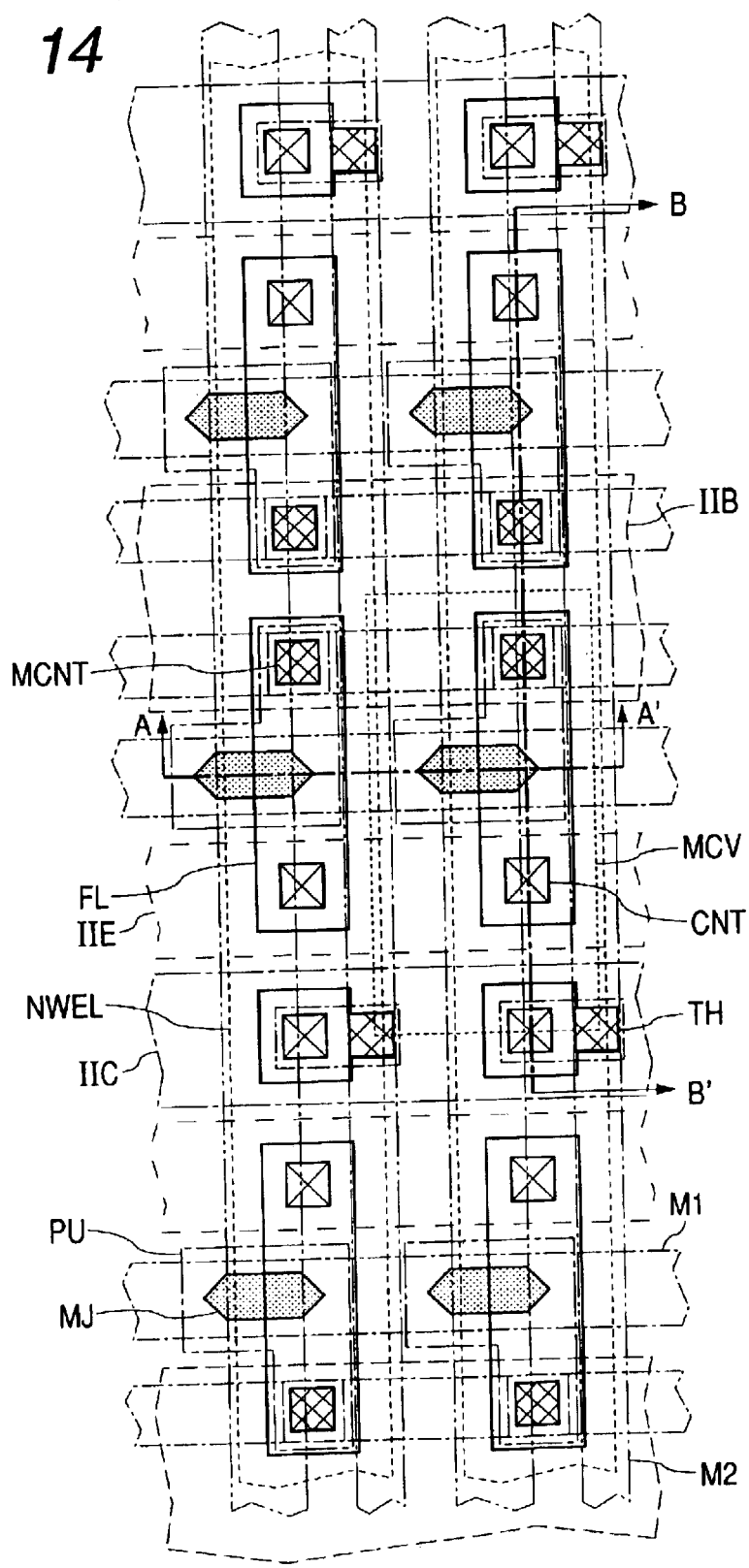
FIG. 14 is a diagram showing a different layout of the memory cells in FIG. 1.

FIG. 14 shows a different memory cell layout, and a broken-line rectangular block MCV is the area of a single memory cell. As in FIG. 9, reference symbol "NWEL" is an n-type well pattern, "FL" is an active area pattern, "IIC", "IIB" and "IIE" respectively denote ion implantation patterns for the collector, base and emitter of the bipolar transistor, "MJ" is an MTJ element pattern, "MCNT" is a memory contact pattern, "CNT" is a contact pattern, "M1" is a first interconnection line pattern, and "M2" is a second interconnection line pattern. Reference symbol "PU" is the upper electrode pattern of the MTJ element, and "TH" is a through hole pattern which connects a first interconnection line 308 to a second interconnection line 315.

Figure 15:
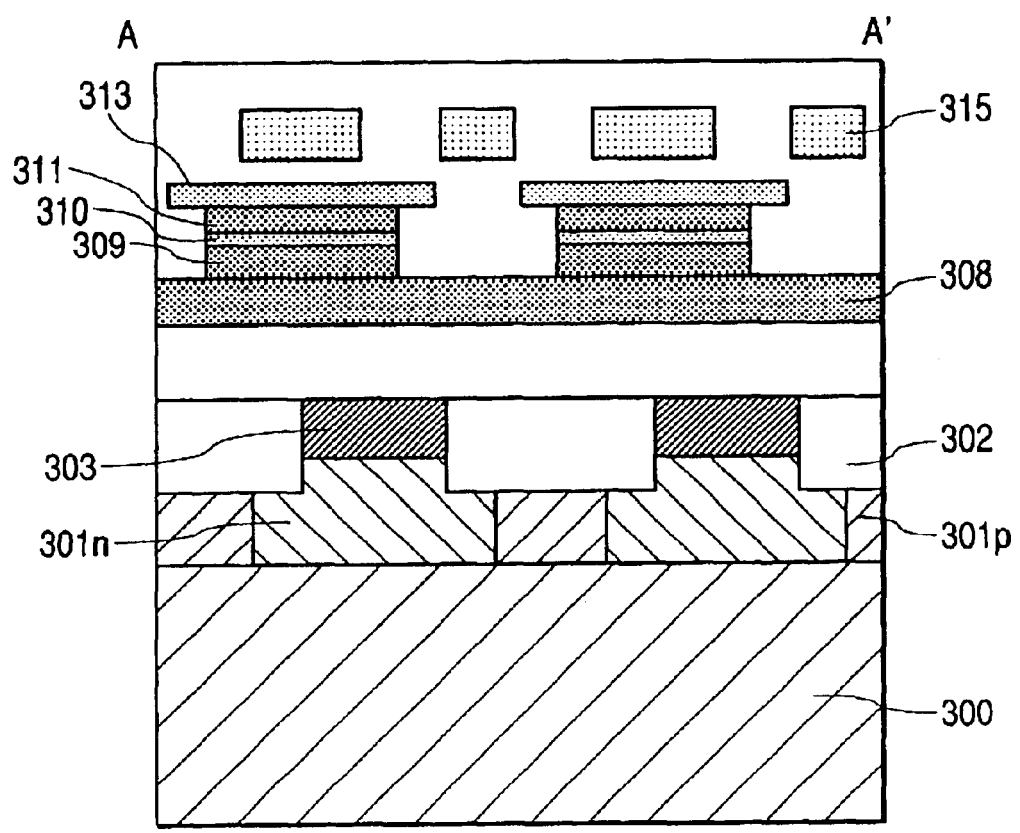
FIG. 15 is a cross-sectional view of a portion of the layout of the memory cells in FIG. 14 along the line A—A'.
Figure 16:
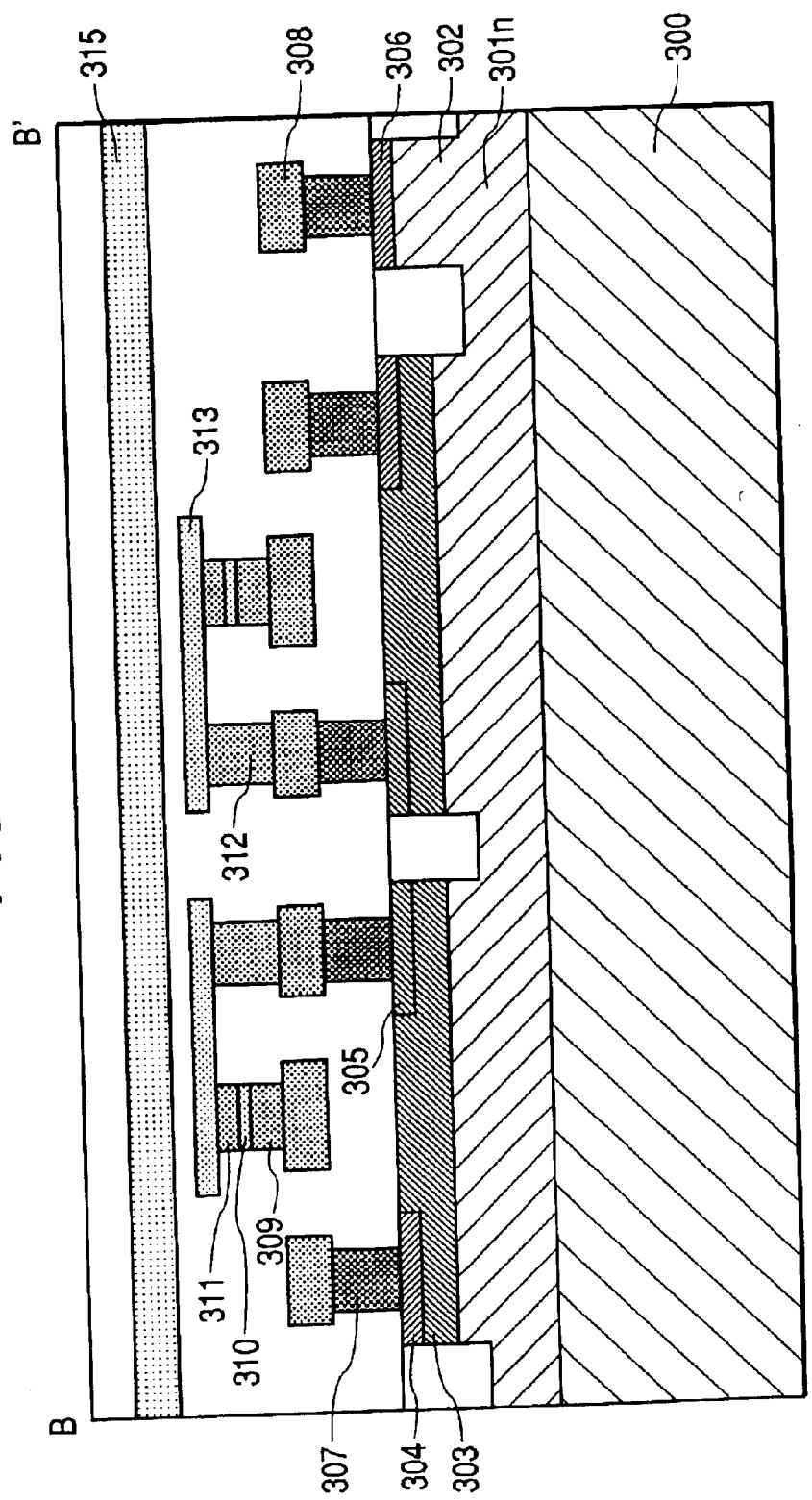
FIG. 16 is a cross-sectional view of a portion of the layout of the memory cells in FIG. 14 along the line B—B'.

FIG. 15 is a cross-sectional view of a portion of the layout of the memory cells in FIG. 14 along the line A—A', and FIG. 16 is likewise a cross-sectional view of a portion of the layout of the memory cells along the line B—B'. In those diagrams, reference symbol "300" denotes a p-type semiconductor substrate. Reference symbol "301n" denotes an n-type well which is formed by the pattern NWEL and will serve as the collector of the bipolar transistor.

Reference symbol "301p" is a p-type well which isolates the n-type well 301n. Reference symbol "302" is an isolation oxide film which is formed in that area which is not surrounded by the pattern FL. Reference symbol "303" is a p-type area which will serve as the base of the bipolar transistor and is formed in an active area where the isolation oxide film 302 is not located.

Reference symbols "304", "305" and "306" respectively denote an n-type diffusion layer which will serve as the emitter of the bipolar transistor, a p-type diffusion layer which becomes the lead-out portion of the base, and an n-type diffusion layer which becomes the lead-out portion of the collector. The three diffusion layers are formed by carrying out ion implantation in accordance with the patterns IIE, IIB and IIC.

Reference symbol "307" is a plug of a contact between the associated diffusion layer and the first interconnection line 308, and the plugs 307 are formed in accordance with the contact patterns CNT and MCNT. The first interconnection line 308 is formed according to the pattern M1, and is used to, for example, connect the word line WL in FIG. 1 which becomes the lower electrode of the MTJ element, the bipolar transistor and the MTJ element.

Reference symbols "309", "310" and "311" respectively denote a fixed ferromagnetic layer, a tunnel insulating film and a free ferromagnetic layer, which are processed according to the MTJ element pattern MJ and constitute the MTJ element. Reference symbol "312" denotes a memory contact which is formed according to the memory contact pattern MCNT and connects the first interconnection line 308 to an upper electrode 313 of the MTJ element. The upper electrode 313 of the MTJ element is processed according to the upper electrode pattern PU.

The second interconnection line 315 is formed according to the pattern M2, and that line of the second interconnection line 315 which runs directly above the MTJ element is the write data line DW in FIG. 1. That line of the second interconnection line 315 which runs through an area where the MTJ element is not located is the read data line DR. The second interconnection line 315 which is equivalent to the read data line DR is connected to the collector lead-out portion 306 via a through hole formed by the pattern TH, the first interconnection line 308 and the contact 307, though it is not seen in the cross section A—A' or the cross section B—B'.

In general, the MTJ element is apt to have a better characteristic if the fixed ferromagnetic layer is formed under the free ferromagnetic layer. As the word line WL in FIG. 1 is arranged under the MTJ element and the write data line DW is arranged thereabove, therefore, it is possible to make the distance between the free layer and the write data line shorter than that in the memory cell structure shown in FIGS. 9 to 11. This permits the write current $I_{D1}$ or $I_{D0}$ shown in FIG. 8 to be made smaller, thus ensuring an operation with low power consumption.

A description will now be given of the general structure of a memory which employs the memory cell structure.

Figure 17:
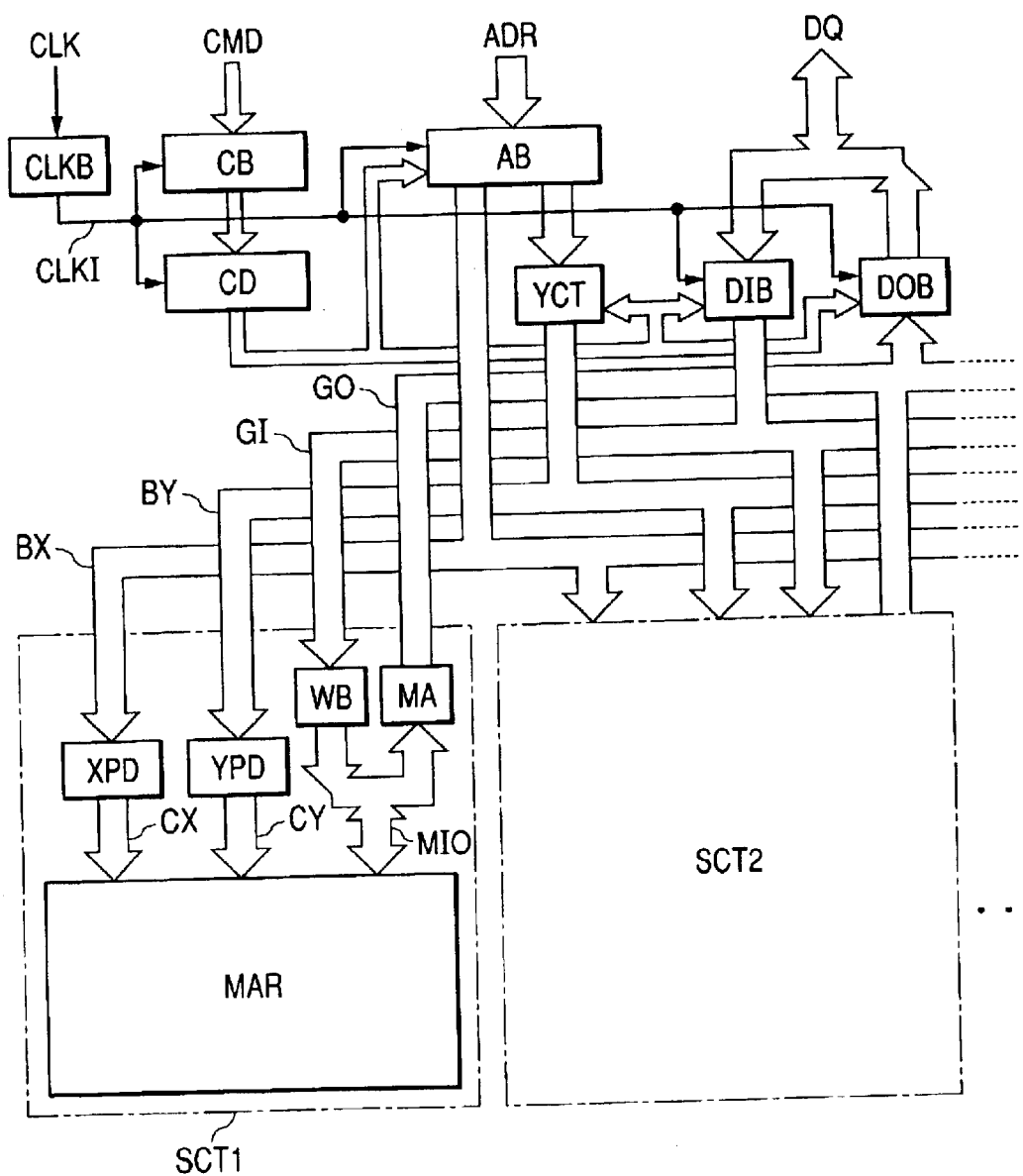
FIG. 17 is a block diagram of essential portions exemplifying the structure of a synchronous type memory.

FIG. 17 is a block diagram of essential portions exemplifying the structure of a synchronous type memory. The synchronous type memory has a clock buffer CLKB, a command buffer CB, a command decoder CD, an address buffer AB, a column address counter YCT, an input buffer DIB and an output buffer DOB. The memory is further provided with sectors SCT1, SCT2, . . . , each including a memory array MAR. Although the sectors-correspond to banks, a plurality of sectors may be provided per bank. Each sector further has a row pre-decoder XPD, a column pre-decoder YPD, a write buffer WB and a main amplifier MA.

The individual circuit blocks perform the following functions.

The clock buffer CLKB distributes an external clock CLK to the command decoder CD, etc. as an internal clock CLKI. In accordance with a control signal CMD, the command decoder CD generates control signals to control the address buffer AB, the column address counter YCT, the input buffer DIB, the output buffer DOB and so forth.

The address buffer AB fetches an address ADR externally at a desired timing according to the external clock CLK and sends a row address BX to the row pre-decoder XPD. The row pre-decoder XPD pre-decodes the row address BX and sends a row pre-decoded address CX to the memory array MAR. The address buffer AB also sends a column address to the column address counter YCT. With the column address as an initial value, the column address counter YCT generates a column address BY for performing a burst operation and sends the column address BY to the column pre-decoder YPD. The column pre-decoder YPD pre-decodes the column address BY and sends a column pre-decoded address CY to the memory array MAR.

The input buffer DIB fetches data in input/output data DQ, which is to be exchanged with an external unit, at a desired timing, and sends write data GI to the write buffer WB.

The write buffer WB outputs the write data GI onto a main input/output line MIO. Meanwhile, the main amplifier MA amplifies a signal on the main input/output line MIO and sends read data GO to the output buffer DOB. The output buffer DOB sends the read data GO to the input/output data DQ at a desired timing.

As apparent from the above, a synchronous type memory can be realized by using the memory cell structure of the invention. As the synchronous type memory is designed to fetch a command and an address and input and output data in synchronism with the external clock CLK, the memory can operate at a high frequency and can achieve a high data rate. Various kinds of fast memory systems that have been developed for SRAM and DRAM can be adapted to the MRAM according to the invention.

Figure 18:
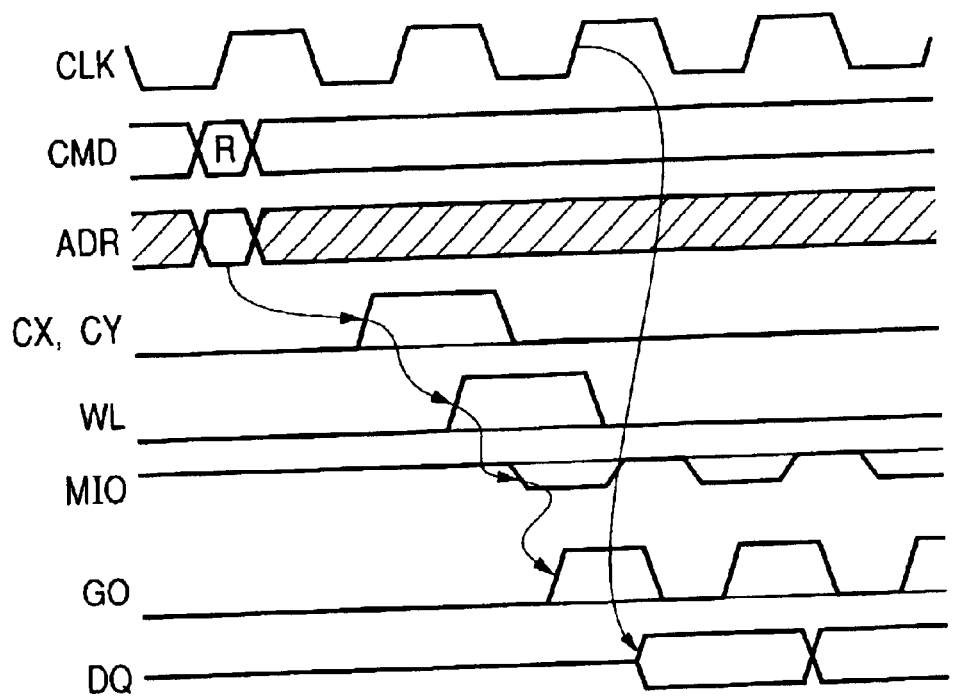
FIG. 18 is a timing chart showing one example of the read-out operation of the synchronous type memory.

FIG. 18 illustrates an example of the timing for the read-out operation of the structure exemplified in FIG. 17. The operation of the synchronous type memory in FIG. 17 will be discussed below according to the timing chart.

At every rising of the external clock CLK, the command decoder CD determines the control signal CMD and acquires a row address and a column address from the address ADR when receiving a read command R and sends the addresses to the address buffer AB. The address buffer AB outputs a row address BX. Upon reception of the row address BX, the row pre-decoder XPD in the sector SCT1 or SCT2 outputs a row pre-decoded address CX and the word line WL shown in FIG. 1 is selected in the memory array MAR.

With the column address sent to the address buffer AB as an initial value, the column address counter YCT operates every clock cycle and the column pre-decoder YPD outputs a column address BY corresponding to the burst operation. Upon reception of the column address BY, the column pre-decoder YPD in the sector SCT1 or SCT2 outputs a column pre-decoded address CY and the read data line DR shown in FIG. 1 is selected in the memory array MAR.

As a result, a signal is read onto the main input/output line MIO, the main amplifier MA outputs read data GO and the output buffer DOB outputs data to the input/output data DQ at a timing corresponding to the external clock CLK.

Here, the row address and column address are simultaneously fetched in response to the read command R. This can ensure detection of only information on the selected data line without a time delay from the acquisition of the row address to the acquisition of the column address which is generally needed in a DRAM. Unlike the DRAM, the MRAM can perform an undestructive read-out operation because it need not detect data of all the memory cells on a word line. The detection of only information on the selected data line can reduce power consumption.

Figure 19:
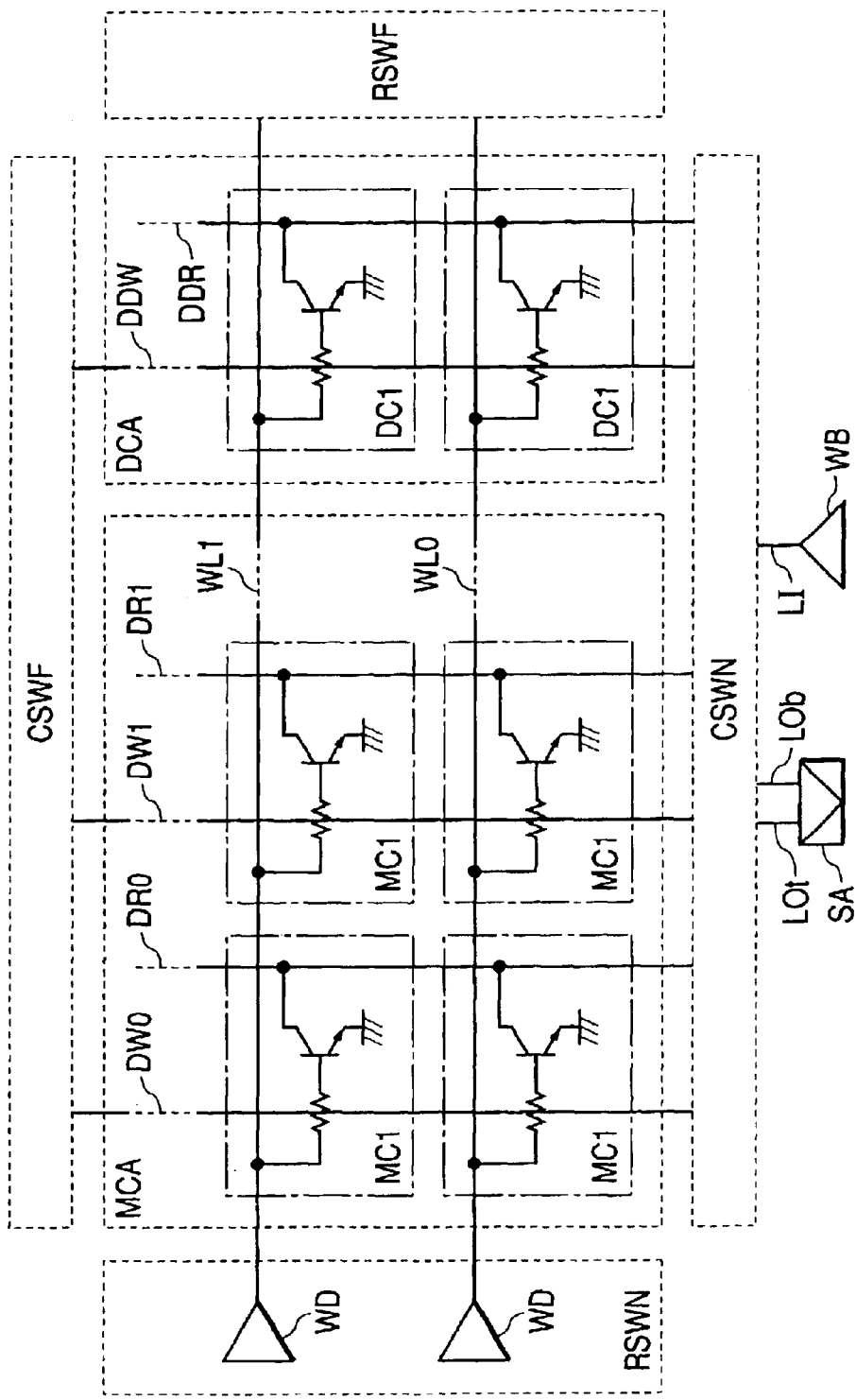
FIG. 19 is a block diagram exemplifying the structure of a part of a memory array.

FIG. 19 shows an example of the structure of a memory array. This structure is used as the memory array MAR in FIG. 17. It is to be noted however that depending on the memory capacity, a plurality of such structures are repeatedly provided to be the memory array MAR in FIG. 17.

As shown in FIG. 17, memory cells MC1 with the structure shown in FIG. 1 are arranged in a matrix form at the intersections of word lines WL0, WL1, . . . , and read data lines DR0, DR1, . . . and write data lines DW0, DW1, . . . in a memory cell array MCA. In a dummy cell array DCA, dummy cells DC1 having a similar structure to that of the memory cells MC1 are arranged at the intersections of the word lines WL0, WL1, . . . , and read a dummy data line DDR and a dummy write data line DDW.

The word lines WL0, WL1, . . . are connected to row control circuits RSWN and RSWF. The row control circuit RSWN includes a word driver WD which selectively drives the word lines. The row control circuit RSWF switches the write operation and the read-out operation from one to the other. The read data lines DR0, DR1, . . . , the write data lines DW0, DW1, . . . , the dummy data line DDR and the dummy write data line DDW are connected to a column control circuit CSWN. The column control circuit CSWN sends a read signal on a desired read data line and a reference signal on the dummy data line to inputs terminals L0$t$ and L0$b$ of a sense amplifier SA in read-out operation mode. The column control circuit CSWN further sends an output LI of the write buffer WB to a desired write data line in write operation mode.

A column control circuit CSWF is provided on the opposite to the column control circuit CSWN with the memory cell array MCA in between. The column control circuit CSWF is connected with the write data lines DW0, DW1, . . . and the dummy write data line DDW and controls the write operation.

Because an operation of accessing only the memory cell that is selected by a word line and data line is suitable for an MRAM, as mentioned earlier, a single sense amplifier SA and a single write buffer WB are provided for the memory cell array MCA so that their area occupying the memory array is small.

The dummy cells DC1 are provided to generate a reference signal at the time of detecting the signal current of the memory cells MC1. While the memory cells MC1 according to the invention have large signal currents due to the current amplification of the bipolar transistors, the signal currents of "1" and "0" have a difference of merely several tens of %. It is therefore possible to compensate for a change in device characteristic which is caused by a change in operational conditions, such as a process variation, the voltage and the temperature, by using the reference signal generated using the dummy cells DC1 whose structure is similar to the structure of the memory cells MC1 and thus ensure a read-out operation with a high S/N ratio. This can realize a fast, highly-integrated and highly-reliable MRAM. Although the dummy cell array DCA is located between the memory cell array MCA and the row control circuit RSWF in this example, the invention is not limited to this structure. For example, the memory cell array may be divided into two between which the dummy cell array is arranged. This arrangement can shorten the maximum distance between the memory cells and the dummy cells, thus reducing the influence of the location of the dummy cell array on the chip onto a change in device characteristic.

Figure 20:
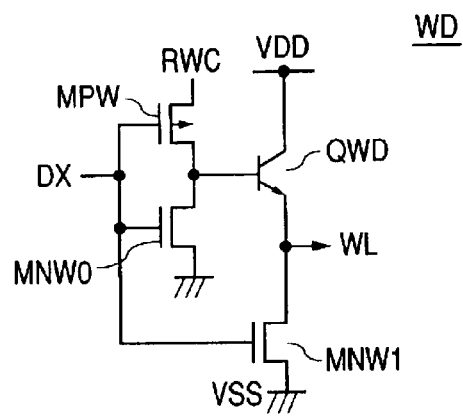
FIG. 20 is a block diagram showing one structural example of a word driver.

FIG. 20 shows one structural example of the word driver WD.

The word driver WD comprises an npn bipolar transistor QWD, a PMOS transistor MPW and NMOS transistors MNW0 and MNW1 and drives the word line WL in accordance with a row decode signal DX. A control signal RWC switches between reading and writing and is a supply voltage VDD in a read-out operation and is an intermediate voltage between the supply voltage VDD and the ground voltage VSS in a write operation. This can ensure control of the word line WL as illustrated in FIGS. 7 and 8. The supply voltage VDD may be an external supply voltage used directly or may be generated internally if the external supply voltage is not adequate.

Voltage control of the word line is important in the memory cell shown in FIG. 1 because the desired voltage is applied to the MTJ element MTJ in read-out operation mode and the current $I_{ws}$ is let flow through the word line WL without enabling the bipolar transistor QMC in write operation mode. The word driver WD is effective as it can drive the word line WL with a low output impedance due to the emitter follower of the npn bipolar transistor QWD. Further, the voltage of the control signal RWC is not used directly in driving the word line WL. This reduces the load on the voltage supply system that generates the intermediate voltage in writing mode.

Because the npn bipolar transistor QWD can be formed at the same time as the bipolar transistor in the memory cell is formed, no fabrication step is increased.

Figure 21:
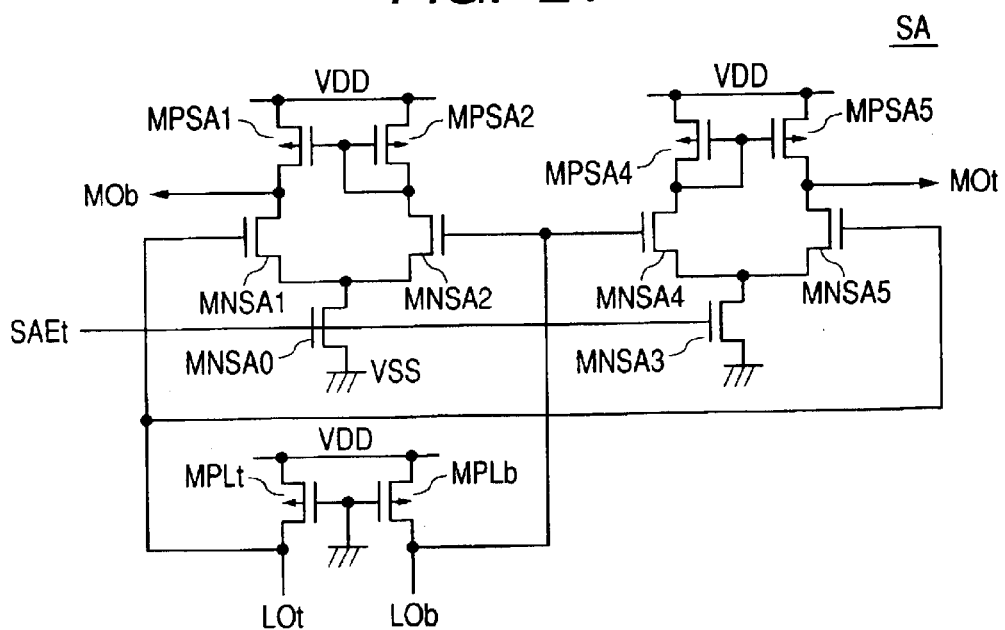
FIG. 21 is a circuit diagram showing one structural example of a sense amplifier.

FIG. 21 shows one structural example of the sense amplifier SA.

PMOS transistors MPLt and MPLb become loads with respect to the signal currents that flow to the inputs terminals L0t and L0b. NMOS transistors MNSA0, MNSA1 and MNSA2 and PMOS transistors MPSA1 and MPSA2 constitute a current mirror type differential amplifier. NMOS transistors MNSA3, MNSA4 and MNSA5 and PMOS transistors MPSA4 and MPSA5 likewise constitute a current mirror type differential amplifier. When the two differential amplifiers are activated by an enable signal SAEt, the differential amplifiers amplify the voltages of the inputs terminals L0t and L0b and output the amplified voltages to output terminals M0b and M0t.

The sense amplifier SA has a structure similar to the structure of the sense amplifier that is typically used in an SRAM and can detect a signal current fast. The use of such a sense amplifier for the memory cell shown in FIG. 1 does not raise any problem because the read data line DR is not included in the path of the current that flows in the MTJ element MTJ so that the voltage of the read data line DR does not influence the current that flows in the MTJ element MTJ. This makes it unnecessary to use a special and complicated sense amplifier.

Figure 22:
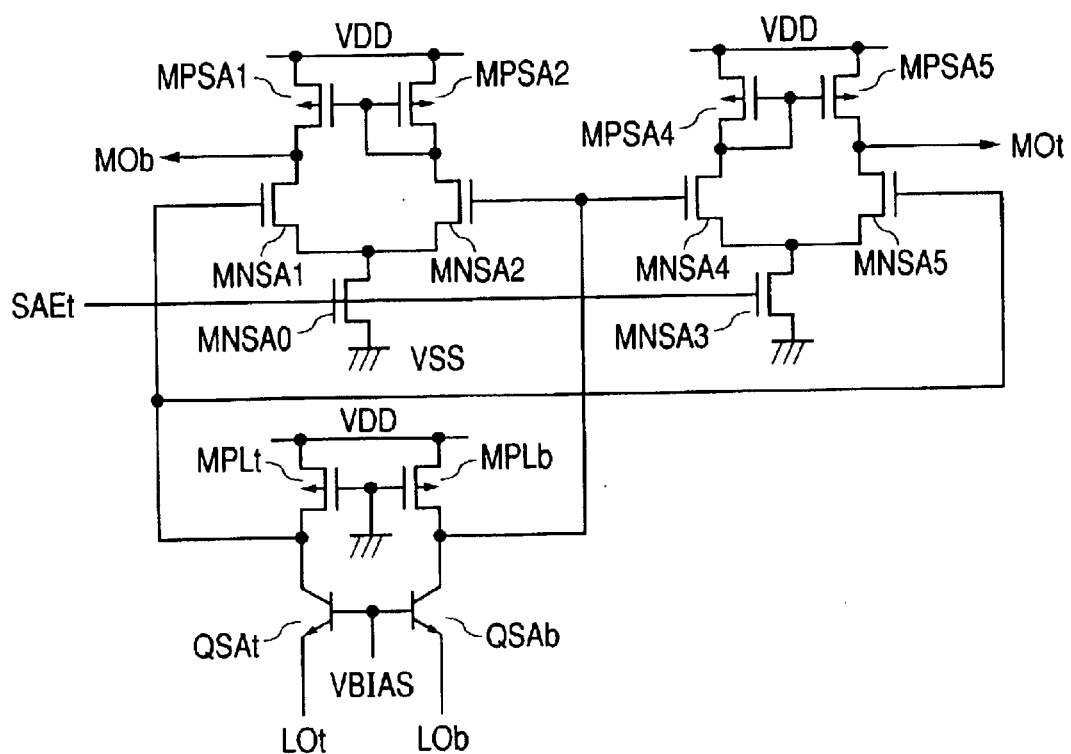
FIG. 22 is a circuit diagram showing another structural example of the sense amplifier.

FIG. 22 shows another structural example of the sense amplifier. The illustrated sense amplifier has npn bipolar transistors QSAt and QSAb in addition to the components of the sense amplifier shown in FIG. 21. The signal currents that flow to the inputs terminals L0t and L0b are input to the emitters of the bipolar transistors QSAt and QSAb to whose bases a bias voltage VBIAS is supplied and are sent to the PMOS transistors MPLt and MPLb that become loads. The voltages are respectively amplified by the current mirror type differential amplifier which comprises the NMOS transistors MNSA0, MNSA1 and MNSA2 and the PMOS transistors MPSA1 and MPSA2 and the current mirror type differential amplifier which comprises the NMOS transistors MNSA3, MNSA4 and MNSA5 and the PMOS transistors MPSA4 and MPSA5. The amplified voltages are respectively sent to the output terminals M0b and M0t.

As the input signals to this sense amplifier are input to the emitters of the bipolar transistors, the voltage amplitudes of the inputs terminals L0t and L0b are small so that the sense amplifier can perform a fast operation. Like the word driver WD shown in FIG. 20, this sense amplifier can effectively utilize the inclusion of the fabrication process of the npn bipolar transistor in the formation of the memory cell.

Figure 23:
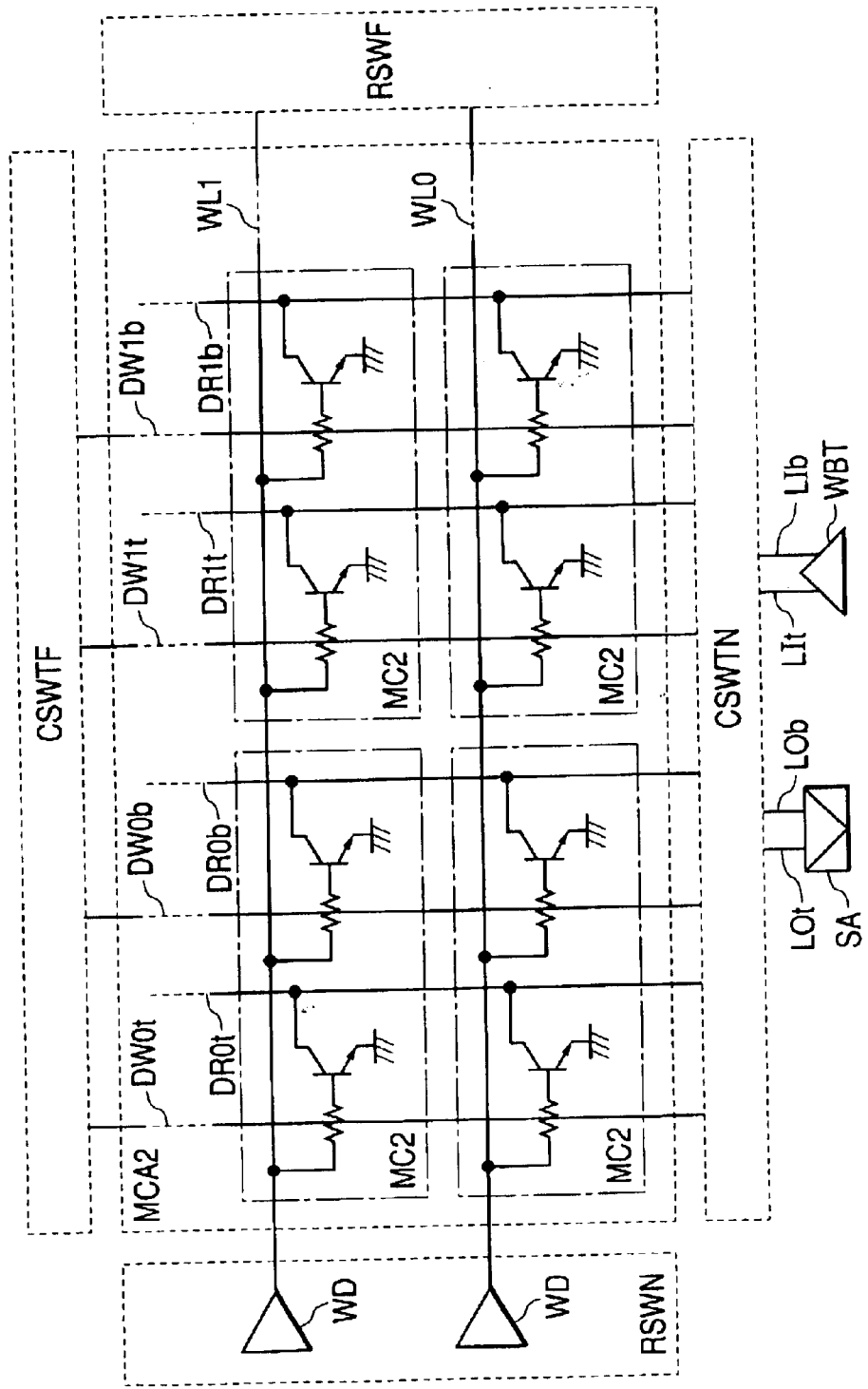
FIG. 23 is a block diagram showing another structural example of a part of the memory array.

FIG. 23 shows another structural example of the memory array. The structure is characterized in a so-called twin-cell structure which uses two memory cells complementarily. As in the example in FIG. 19, such a structure or the repeated arrangement of a plurality of such structures is used as the memory array MAR in FIG. 17.

Memory cells MC2 are arranged in a matrix form at the intersections of the word lines WL0, WL1, . . . , and read data line pairs DR0t and DR0b, DR1t and DR1b, . . . and write data line pairs DW0t and DW0b, DW1t and DW1b, . . . in a memory cell array MCA2. The memory cell MC2 is constructed by two memory cells shown in FIG. 1, i.e., two MTJ elements and two npn bipolar transistors. One of the two MTJ elements are controlled in different states, one in a low resistance state and the other in a high resistance state.

As in the structure shown in FIG. 19, the word lines WL0, WL1, . . . are connected to the row control circuit RSWN including the word driver WD and the row control circuit RSWF that is arranged opposite to the row control circuit RSWN with the memory cell array MCA2 in between. The row control circuit RSWN selectively drives the word lines. The row control circuit RSWF switches the write operation and the read-out operation from one to the other. The read data line pairs DR0t and DR0b, DR1t and DR1b, . . . , and the write data line pairs DW0t and DW0b, DW1t and DW1b, . . . are connected to a column control circuit CSWTN. The column control circuit CSWTN sends a differential read signal on a desired read data line pair to the inputs terminals L0t and L0b of the sense amplifier SA in read-out operation mode. The column control circuit CSWTN further sends complementary outputs LIt and LIb of the write buffer WB to a desired write data line pair in write operation mode. A column control circuit CSWTF is provided on the opposite to the column control circuit CSWTN with the memory cell array MCA2 in between. The column control circuit CSWTF is connected with the write data line pairs DW0t and DW0b, DW1t and DW1b, . . . and controls the write operation.

The twin-cell structure allows a differential read signal current to flows in the read data line pair. The memory cells MC2 according to the invention have large signal currents due to the current amplification of the bipolar transistors and can perform a read-out operation with a higher S/N ratio because of the twin-cell structure. Since currents of the opposite directions have only to be let flow in the write data line pair in write operation mode, the column control circuit CSWTF should merely connect the selected pair of write data lines to each other. The structure can therefore be simplified.

Although the foregoing description has been given of preferred embodiments of the invention, the invention is not limited to the embodiments but can be subjected to various design modifications without departing from the technical scope of the invention. For example, the invention can be adapted not only to an MRAM as shown in FIG. 17 itself but also to a system LSI having such an MRAM mounted thereon. As the invention can ensure a read-out operation with a high S/N ratio, the invention can set a large operational margin so that it is suitable for a system LSI which generally has a short design period. Further, a memory cell can be constructed by using a pnp bipolar transistor, not an npn bipolar transistor. In this case, the voltage relationship should be reversed and the conductivity types of the transistors of the peripheral circuits have only to be changed as needed. While npn bipolar transistors generally have better characteristics, the use of pnp bipolar transistors may make the memory array smaller depending on the conductivity type of the substrate and the well structure of the peripheral circuits in some cases.

According to the invention, as apparent from the foregoing description of the embodiments, an MRAM which uses memory cells for storing information by utilizing a change in magnetoresistance can perform a read-out operation with a high S/N ratio by amplifying the current that flows in the magnetoresistive element by means of a bipolar transistor and reading the amplified current. This can realize a fast, highly-integrated and highly-reliable MRAM and a semiconductor device which uses the MRAM.

What is claimed is:

1. A semiconductor device comprising;
   a plurality of memory cells each of which includes a bipolar transistor and a resistive element;
   a plurality of word lines for selecting said plurality of memory cells; and
   a plurality of data lines which are so laid out as to be perpendicular to said plurality of word lines and through which signals are read out from said plurality of memory cells,
   wherein a resistance value of the resistive element varies in accordance with an information stored therein, and
   wherein the resistive element has one end connected to an associated one of said plurality of word lines and the other end connected to a base of said bipolar transistor.

2. A semiconductor device according to claim 1,
   wherein when one of said plurality of memory cells stores a first information, the resistive element is in a first state,
   wherein when one of said plurality of memory cells stores a second information which is different from the first information, the resistive element is in a second state, and
   wherein the resistance value of the resistive element in the first state is higher than the resistance value of the resistive element in the second state.

3. A semiconductor device according to claim 2, further comprising:
   a column control circuit coupled to said plurality of data lines;
   a sense amplifier coupled to said column control circuit; and
   a row control circuit coupled to said plurality of word lines,
   wherein when an information stored in one of said plurality of memory cells is read out, said row control circuit selects one of said plurality of word lines and said column control circuit selects one of said plurality of data lines to transfer a read signal in accordance with the information read out therefrom to said sense amplifier.

4. A semiconductor device according to claim 3,
   wherein said sense amplifier is a current mirror type differential amplifier for amplifying a difference of current value between the read signal and a reference signal.

5. A semiconductor device according to claim 4, further comprising:
   a plurality of dummy memory cells,
   wherein when the stored information is read out from one of said plurality of memory cells, one of said plurality of dummy memory cells supplies the reference signal to said sense amplifier.

6. A semiconductor device according to claim 1,
   wherein a collector of said bipolar transistor is connected to an associated one of said plurality of data lines.

7. A semiconductor device according to claim 1,
   wherein the bipolar transistor is made of a semiconductor substrate, and
   wherein a maximum length of bit line direction of a base area of the bipolar transistor is shorter than a maximum length of word line direction of a base area of the bipolar transistor.

8. A semiconductor device according to claim 7,
   wherein the resistive element is made over the semiconductor substrate, and
   wherein a maximum length of bit line direction of the resistive element is shorter than a maximum length of word line direction of the resistive element.

9. A semiconductor device comprising:
   a plurality of memory cells each of which includes a bipolar transistor and a resistive element;
   a plurality of word lines for selecting said plurality of memory cells; and
   a plurality of data lines which are so laid out as to be perpendicular to said plurality of word lines and through which signals are read out from said plurality of memory cells,
   wherein a resistance value of the resistive element corresponding to a first stored information is higher than the resistance value of the resistive element corresponding to a second stored information, and
   wherein the resistive element has one end connected to an associated one of said plurality of word lines and the other end connected to a base of said bipolar transistor.

10. A semiconductor device according to claim 9, further comprising:
    a column control circuit coupled to said plurality of data lines;
    a sense amplifier coupled to said column control circuit; and
    a row control circuit coupled to said plurality of word lines,
    wherein when an information stored in one of said plurality of memory cells is read out, said row control circuit selects one of said plurality of word lines and said column control circuit selects one of said plurality of data lines to transfer a read signal in accordance with the information read out therefrom to said sense amplifier.

11. A semiconductor device according to claim 10, wherein said sense amplifier is a current mirror type differential amplifier for amplifying a difference of current value between the read signal and a reference signal.

12. A semiconductor device according to claim 11, further comprising:
    a plurality of dummy memory cells,
    wherein when the stored information is read out from one of said plurality of memory cells, one of said plurality of dummy memory cells supplies the reference signal to said sense amplifier.

13. A semiconductor device according to claim 9, wherein a collector of said bipolar transistor is connected to an associated one of said plurality of data lines.

14. A semiconductor device according to claim 9, wherein the bipolar transistor is made of a semiconductor substrate, and
    wherein a maximum length of bit line direction of a base area of the bipolar transistor is shorter than a maximum length of word line direction of a base area of the bipolar transistor.

15. A semiconductor device according to claim 14, wherein the resistive element is made over the semiconductor substrate, and
    wherein a maximum length of bit line direction of the resistive element is shorter than a maximum length of word line direction of the resistive element.

* * * * *